INVENTORS
WILLIAM J. DOBBIN
ARTHUR E. LESSOR JR.
FRED S. MADDOCKS
BY Frederick D. Poag
ATTORNEY United States Patent Office 3,314,869

Patented Apr. 18, 1967

3,314,869

METHOD OF MANUFACTURING MULTILAYER MICROCIRCUITRY INCLUDING ELECTROPOLISHING TO SMOOTH FILM CONDUCTORS

William J. Dobbin, Endwell, Arthur E. Lessor, Jr., West Hurley, and Fred S. Maddocks, Kingston, N.Y., assignors to International Business Machines Corporation, New York, N.Y., a corporation of New York Filed Jan. 21, 1963, Ser. No. 252,628
7 Claims. (Cl. 204—140.5)

Figure 1:
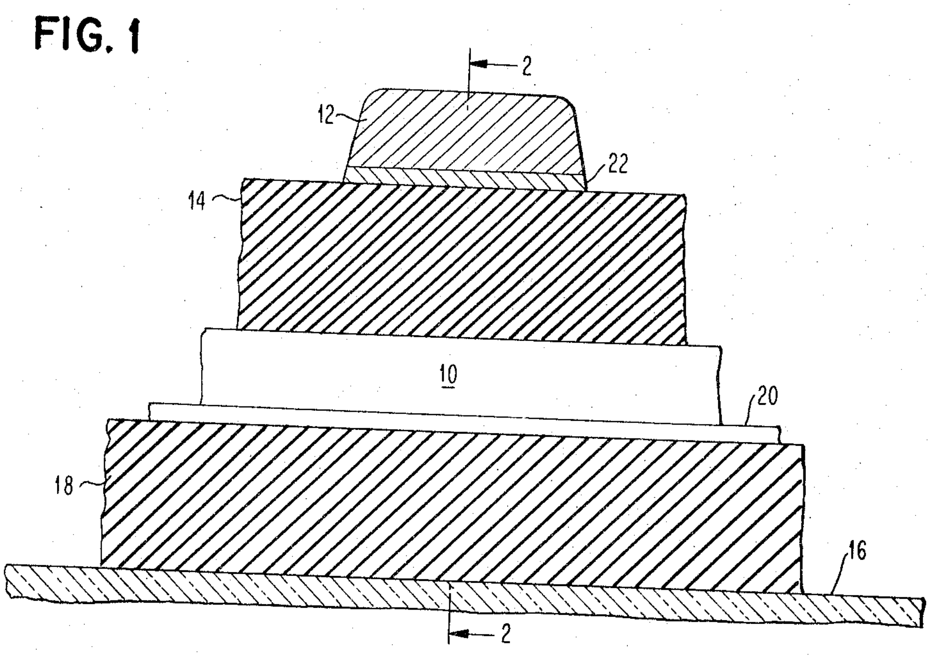

This invention relates to the art of microcircuitry manufacture and more particularly to process improvements applicable to the fabrication of film circuit cards having superposed conductor layers insulated from each other by intervening dielectric material.

In response to the demand for more and more refined miniaturization of electronic circuitry there have been developed, as is well known in the art, a number of schemes of circuitry construction. Several of these schemes employ a multi-layer sandwich of configured films of conductor, resistance, and dielectric material, oriented and lapped in such manner as to form desired circuit paths. Typically, the conductor paths may be about one-half millimeter wide and one micron thick. Where insulated crossovers are desired, the crossing conductors are separated from each other by an intervening layer of dielectric material which is also very thin.

It is highly desirable that the films be stable, firmly adherent, and otherwise resistant to a variety of mechanical, thermal and electrical stresses. For example, in some circuit construction schemes, conductor lines of the multi-layer structure are tinned and then transitsor or other elements are soldered thereto. Frequently, vacuum deposited chromium is used as a primer or underlayer for copper conductor lines, for improving the adherence of the copper to the dielectric, which is, typically, silicon monoxide. In view of the thinness of the silicon monoxide layer, the high energy deposition of chromium thereover tends all the more to aggravate the problem of insulation breakdown at crossovers. At the same time, any process improvement for reduction of crossover insulation failure must take into account the delicate nature of the structures involved and the requirement that the inter-adherence of the superposed layers must not be diminished.

It appears that a major factor leading to insulation breakdown at crossovers as above described is the presence of sharp projections and corners in the surface of the lower conductor at the crossover point. The sharp projections result from particle ejection from the conductor metal source when that conductor metal is vacuum deposited. The corners of the sidewalls with the top surface of the conductor line may be very sharp corners, particularly when the conductor line is configured by etching processes.

In accordance with the present invention, electropolishing methods are provided whereby the projections are smoothed and the sharp corners are rounded, all in a manner which has been found to decrease substantially the insulation failure rate at crossovers. As aforesaid, the conductor lines to be electropolished are of small cross-sectional dimension; in fact, they may be far thinner than the surface irregularities generally sought to be removed by ordinary electropolishing. Furthermore, the conductor line segments to be polished may be and usually are in the form of a myriad of disconnected segments so that a problem arises in making connection to the individual segments for completing a circuit thereto for the electropolishing process. To meet these problems, a current feeding system is provided which connects to each of the conductor segments to be polished and is characterized by ability to withstand the electropolishing action and yet be readily removable without damage to the polished conductor segments. At the same time, the electrolyte for use in the electropolishing step is especially adapted to the removal and smoothing of projections and corners on the thin, fairly narrow conductor elements, without destructive removal of the elements themselves.

Accordingly, a principal object of the invention is to improve the manufacture of multi-layer film circuit assemblies.

Another object of the invention is to provide an improved process and means for removing projections and sharp corners from conductor elements, in the manufacture of film circuit assemblies as aforesaid.

Still another object of the invention is to provide an improved electropolishing technique especially adapted to the problems encountered in the aforementioned removal of projections and sharp corners from thin film elements.

Yet another object of the invention is to provide temporary current feeding means for employment in accordance with the aforesaid electropolishing technique.

Still another object of the invention is to provide an improved electrolyte for effecting electropolishing on a microscopic scale as required in the aforesaid technique and process, which electrolyte is compatible with the improved current feeding means and leaves the same in a condition enabling its ready removal by a later, selective etch step.

The foregoing and other objects, features and advantages of the invention will be apparent from the following, more particular description of the preferred embodiments of the invention, as illustrated in the accompanying drawings.

Figure 2A:
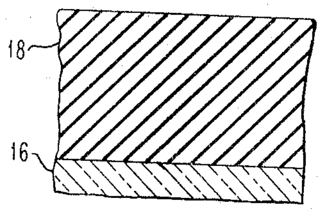
Figure 2B:
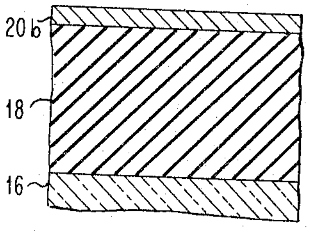
Figure 2C:
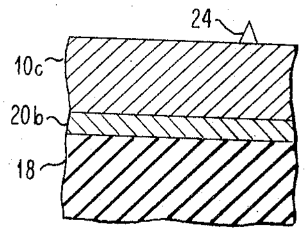
Figure 2D:
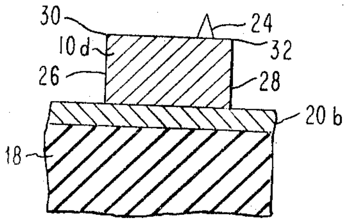
Figure 2E:
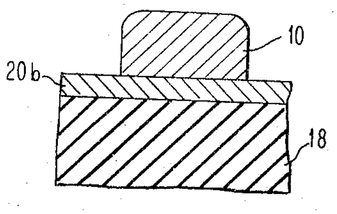
Figure 3:
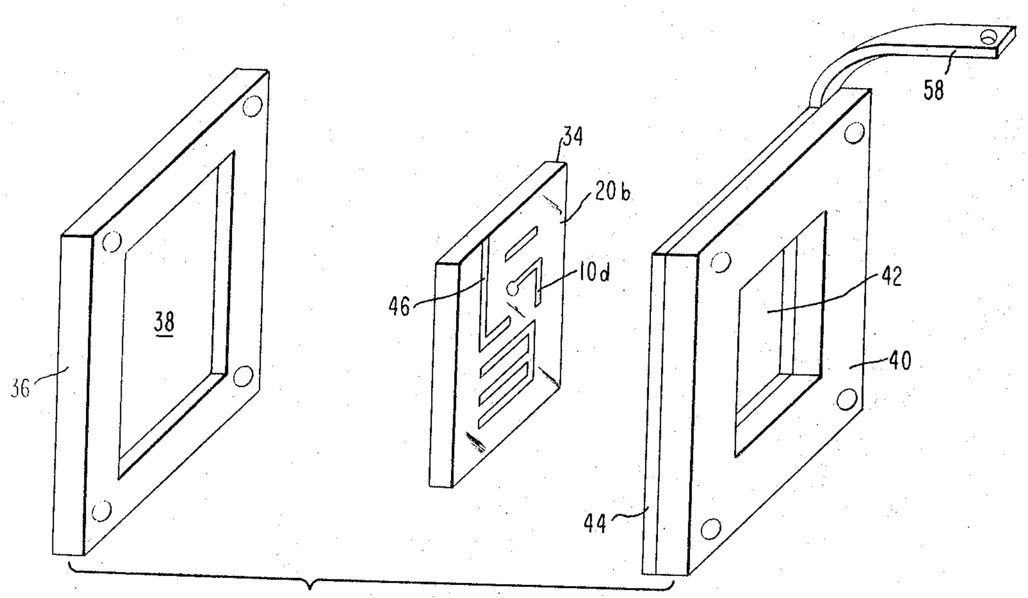
Figure 4:
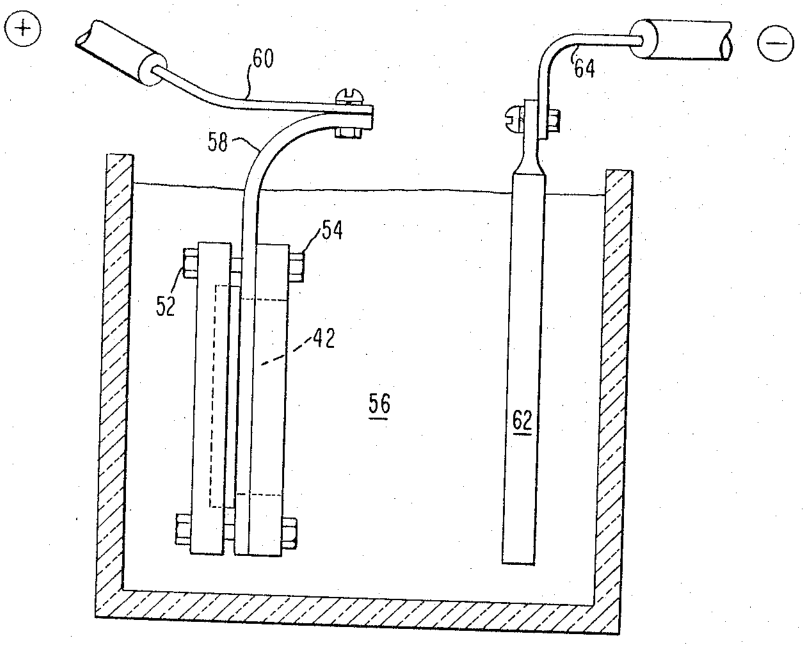

FIG. 1 is a fragmentary, sectional view of a multi-layer film assembly manufactured by a process embodying the invention;

FIGS. 2*a* through 2*f* constitute a series of fragmentary sectional views corresponding to successive process steps in the fabrication of the assembly of FIG. 1, as seen along section lines 2—2 of FIG. 1;

FIG. 3 is an exploded, diagrammatic view of a circuit card workpiece and an electrode jig for use therewith in accordance with a process step of the invention; and FIG. 4 is a diagrammatic representation of an electropolishing step of the invention, employing the workpiece and jig of FIG. 3 to effect the workpiece modification represented by FIG. 2*e* as compared to FIG. 2*d*.

FIG. 1 illustrates, more or less diagrammatically, a typical crossover in a film circuit assembly. The crossover comprises a first conductor line 10 separated from a second conductor line 12 by a layer of insulating material 14 such as silicon monoxide. Lower layers of the assembly may comprise a polished glass substrate 16 coated with silicon monoxide or other suitable dielectric 18, and each of the conductors 10, 12 may have a thin underlayer 20, 22, for example, of chromium, for improving the adhesion of the conductor layers 10, 12 to the dielectric layers 18, 14 thereunder. Typically, these several layers are deposited on the glass substrate 16 by vacuum evaporation. It is often preferred that the plan configuration of the lower level conductor 10 (and its associated underlayer 20) be formed by etching, while the conductors of the upper layer, of which conductor 12 (together with its underlayer 22) is a member, are formed by masking during the evaporation thereof.

The vacuum apparatus utilized for deposition of the various materials may be of the usual construction and is therefore not shown. Of course, the rate of evaporation of material from the sources utilized in depositing the various layers is kept low enough to avoid massive ejection of evaporant material. Nevertheless, there have been noted numerous small projections such as shown at 24 in FIGS. 2*c* and 2*d*, which apparently are the result of the ejection of microscopic particles from the evaporant source. In any case, the present invention provides means for removal of such projections and certain other sharp edges when they occur in positions wherein they would otherwise tend to disrupt the integrity of the insulation layer 14.

As will be set forth in greater detail in a specific example hereinafter, the first step in the fabrication of the crossover shown in FIG. 1 is, as indicated in FIG. 2*a*, to deposit a layer of dielectric such as silicon monoxide 18 on the underlying material, which, in this case, is the polished glass substrate 16. The next step, as indicated in FIG. 2*b* is to deposit a thin layer 20*b* which, in accordance with the invention, will serve not only as an adhesion improving interlayer but also as a temporary current feeding means for electropolishing purposes. In FIG. 2*c* there is represented the result of the next deposition, in this case a layer of conductor material 10*c* from which will be formed the lower conductor element 10 of the crossover. Typically, layer 20*b* is of chromium and layer 10*c* is copper.

Frequently, the conductor elements of the first conductor layer constitute a myriad of complex shapes and segments which would be difficult if not impossible to represent in a single mask for delineating these elements during evaporation. Accordingly, it is frequently desired to "carve" these conductor elements from the first layer 10*c* by means of chemical etching. Thus, these elements may be shaped conveniently, in any complexity, by the use of photo-art work, silk screen, or other well known methods. FIG. 2*d* shows a conductor element 10*d* produced by such a chemical etch. The resulting substantially vertical walls 26, 28 at the sides of the conductor element 10*d* make sharp corners 30, 32 with the top surface of such a conductor line, which sharp corners have a geometry in some respects similar to the sharp point 24 on the projection caused during the evaporation of the material of the conductor line.

In accordance with the invention, the sharp corners 30, 32 and the projection 24 are removed by electropolishing. For this purpose, a jig as shown in FIG. 3 may be employed for making contact to the elements of the film circuit workpiece 34 to be electropolished. For purposes of illustration, the conductor element or segment 10*d* is shown in FIG. 3 as one which does not lead directly to a connection land at the edge of the workpiece 34. However, it is in electrical contact with the underlayer 20*b*, and it is through this underlayer that electrical connection is made to the segment 10*d* for enabling electropolishing of the same.

The jig shown in FIG. 3 comprises a phenolic backing block 36 having means such as a shallow depression 38 for receiving and locating the underside of the workpiece 34. The companion member 40 of the jig comprises a frame of conductor clad phenolic having a window 42 for exposing the portions of the workpiece 34 to be electropolished. The conductor of the member 40 is compatible with the workpiece and the electropolishing bath. In the examples given herein it may be copper. This frame or border 44 of copper surrounding the window 42 is arranged to contact border portions of the face side of the workpiece 34, when the workpiece is clamped between the jig pieces. In many cases, some of the conductor elements on the face of the workpiece run to the edge thereof to form a connection land, such as is shown at 46. Preferably, the frame 40 is flexible enough to make contact with the face of the workpiece periphery in a distributed manner, despite such minor variations in its surface. Thus contact is made to land 46 where such exists and to the conductive layer 20*b* elsewhere; in either case the conductive layer 20*b* serves as an interconnection to isolated elements such as the element 10*d*.

The electropolishing step is carried out in a bath as indicated diagrammatically in FIG. 4. The workpiece 34 is clamped between the jig pieces 36, 40 by means of nylon or other suitably non-reactive bolts and nuts 52, 54 so that the face of the workpiece 34 to be electropolished is exposed to the electrolyte 56 through the window 42. As aforedescribed, the copper frame part 44 of the jig piece 40 makes contact to the face of the workpiece to be polished. The part 44 has a connection strap 58 for attachment to the positive side 60 of the power supply of the electropolishing apparatus of FIG. 4. The face of the workpiece 34 is thus made to be the anode in the bath 56, the cathode being a plate 62 parallel thereto in the bath 56 and connected to the negative side of the electropolishing power supply as indicated at 64. In the examples given herein, the cathode 62 may be of copper.

The result of the electropolishing step is diagrammed at FIG. 2*e*, wherein the conductor element 10 has been formed to its final shape. Comparing this element 10 of FIG. 2*e* to its former state as shown at 10*d* in FIG. 2*d*, it is seen that the projection 24 and the sharp corners 30, 32 have been removed by the electropolishing action.

The next step in the manufacturing process is to remove the exposed portions of the conductive layer 20*b* which would otherwise undesirably interconnect the various conductor elements such as the conductor line 10 thereon. This removal may be effected by a selective chemical etch which attacks the material, e.g. chrominum, of layer 20*b* which is exposed, without attacking the material of the conductor line 10. Alternatively, the line 10 could be coated temporarily with a protective material while the unwanted material of layer 20*b* is etched away.

Figure 2F:
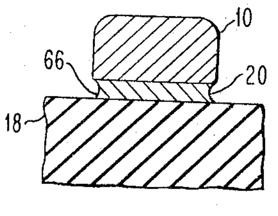

Once the conductor element 10 and the corresponding underlayer 20 have been given their final form as indicated in FIG. 2*f*, the remaining layers 14, 22, 12 (FIG. 1) may be evaporated therover in the usual manner. It is noted that, for purposes of illustration, the configuration of the top conductor line 12 and its underlayer 22 is shown in somewhat tapered form seen when such elements are deposited through a mask. This results in less sharp corners at the side of the conductor line, as compared to the sides of an etched conductor element such as the element 10*d* illustrated in FIG. 2*d*. However, it should be noted that even had the element 10*d* of FIG. 2*d* been configured by use of a mask, there would still have been the possibility of a sharp projection such as at 24 intruding upon the layer of insulation 14 thereover and being therefore a potential site of insulation breakdown. Accordingly, the utility of the electroploshing step of the invention is not limited to those cases in which the conductor lines which are electropolished have been formed by an etching step.

Following are more specific details which are typical of the aforedescribed process steps:

*Step 1.*—Evaporate layer 18, SiO, 2 microns thick; vacuum chamber pressure: $1\times10^{-6}$ Torr, substrate temperature: 350° C.

Result—FIG. 2*a*.

*Step 2.*—Evaporate layer 20*b*, 0.04 micron thick; vacuum chamber pressure: $5\times10^{-6}$ Torr; substrate temperature: 170° C.

Result—FIG. 2b.

*Step 3.*—Evaporate layer 10c, Cu., 1.25 microns thick; vacuum chamber pressure: $5\times10^{-6}$ Torr; substrate temperature 170° C.

Result—FIG. 2c.

*Step 4.*—Apply configured protective layer for defining outline of element 10d. Example of protective layer:

(a) Kodak Photo Resist, or
(b) Silk Screened Asphalt Paint, or
(c) De Khotinsky Cement

*Step 5.*—Etch away unprotected portions of layer 10c while leaving all portions of layer 20b. Any etch which attacks copper but not chromium may be used, for example: ferric chloride, 30 grams per liter at 25° C. Chromic acid is another example of a suitable etching agent.

*Step 6.*—Remove protective layer from element 10d. For example: Kodak Photo Resist ("KPR") may be removed by immersion in cyclohexanone with ultrasonic agitation, asphalt paint may be removed by trichlorethylene De Khotinsky Cement may be removed by alcholol or trichlorethylene.

Result—FIG. 2d.

*Step 7.*— Electropolish 0.25 micron off of the surface of element 10d, using a non-reducing, viscous electropolishing electrolyte 56 in the apparatus of FIG. 4.

*Examples*

(a) For the electrolyte 56, use 50% by volume of orthophosphoric acid and 50% by volume of saturated aqueous solution of sodium lauryl sulphate. Temperature: 25° C.; Current: 0.165 amp. per sq. centimeter of copper to be polished. The voltage required, when, as is desired, the spacing of the workpiece 34 from the cathode 62 is about two inches and the cathode has about the same shape and area as the face of the workpiece, is in the order of one volt, and the time required for the desired slight electropolishing action desired is about 5 second.

(b) For the electrolyte 56, use 50% by volume orthophosphoric acid and 50% by volume of 2% by weight aqueous solution of sodium carboxymethylcellulose. In all other respects, proceed the same as Example (a) immediately above.

(c) For the electrolyte 56, use Metex L-5, a commercial copper cleaning solution. In all other respects, proceed the same as Examples (a) and (b) immediately above.

In each example, electrolyte 56 is viscous so as to provide the desired electropolishing action and is non-reducing so as to avoid depassivation of the chromium layer 20b.

Result—FIG. 2e.

*Step 8.*—Remove the exposed portions of layer 20b, using a selective etch which does not affect element 10:

Etch bath examples:

(a) Aluminum chloride in water to specific gravity of 32°Ze'. Zinc chloride to raise the specific gravity of the solution to 41° Be'. Phosphoric acid, 30 cc. per liter of the above solution.

(b) 6 normal hydrochloric acid, in a non-oxidizing environment.

In either case, contact the chromium to be etched with zinc pellets in the bath, for depassivation purposes. Then proceed with the etching in the bath until the chromium is completely removed.

Result—FIG. 2f.

*Step 9.*—Evaporate layer 14, SiO, 2 microns thick, using the same procedure as in Sept 1.

*Step 10.*—Evaporate layer 22, Cr, 0.04 micron thick. Use the same procedure as in Step 2, except utilize a mask during evaporation to delineate the boundaries of the layer to give the same a conductor line configuration.

*Step 11.*—Evaporate layer 12, Cu, 1.0 micron thick. Employ the same procedure as in Step 3, using the same mask as in Step 10. If desired, the Step 11 evaporation can be initiated shortly before the Step 10 evaporation is terminated, so that during a short overlap period, chromium and copper are deposited simultaneously and therefore commingled, for better adhesion.

As indicated at 66, FIG. 2f, the chromium removal Step 8 tends to undercut the conductor element 10 slightly but when the chromium layer 20b is thin, this undercutting is not of such a magnitude as to be serious. For example, the 0.04 micron (400 angstrom units) thickness given above for this chromium layer can be etched away selectively as above described without serious undercutting of the element 10. However, in other experiments otherwise similar to the example given above, it has been found that, on the one hand, a layer of chromium only 100 angstrom units thick suffers noticeable thinning in the electro-polishing bath, and, on the other hand, a chromium layer of 1,000 angstrom units is so thick that when it is selectively etched away, serious undercutting of the conductor elements such as element 10 results.

Moreover, when the thickness of the chromium layer 20b is in a midrange such as the 400 angstrom unit thickness given above, adequate electro-polishing current is distributed to the copper elements to be polished during Step 7. The preferential dissolution of the copper into the phosphoric acid of Step 7 is such that even segments of copper conductor lines such as 10d considerably remote from the contact apparatus 44 of the jig of FIG. 3 are electro-polished satisfactorily while the thin chromium layer 20b immediately adjacent to the jig remain intact.

Copper, chromium, and siliconmonoxide are given in the specific examples as materials involved in the crossover to be manufactured, for a variety of reasons. Copper is a good conductor, and is readily tinned for attachment of active elements or other connections to the film circuit panel of which the crossover is a part. Chromium is a favorable choice as the temporary current feeding means for use during electro-polishing because it does not erode significantly during the electro-polishing step, it serves also to improve the adhesion of the copper to the silicon monoxide, and, at the same time, it is selectively etchible with respect to the copper as above described. Silicon monoxide is a good insulator which is readily evaporable.

It will be understood, however, that other combinations of materials could be employed in accordance with the teachings of the invention. As pointed out above, the layer 20b could be removed by means other than a selective etch. However, the fact that surface of the chromium layer 20b is passivated (e.g., by mere exposure to the atmosphere), or that the material of the layer 20b is otherwise resistant to the electro-polishing bath, enables the layer 20b to be made desirably thin. In some cases, as where direct contact is made to the conductor lines (e.g., 46, FIG. 3), the use of the layer 20b as a current feeder would not be absolutely necessary.

So also, other materials could be substituted for the copper in layer 10c, with the electro-polishing electrolyte 56 being chosen in accordance therewith. The chief criteria for selection of this pair of materials revolve around the desire to electro-polish very thin layers.

The usual commercial electro-polishing procedures involve the removal of relatively gross surface features, often projecting above the surrounding surface far more than the whole conductor element 10d dealt with in the present case. In contrast, the electrolyte 56 employed in accordance with an aspect of the present invention is made viscous in such manner as to enable a minute electro-polishing action, which attacks salient projections 24 and corners 30, 32 on an element 10d which itself is only about a micron high and a half-millimeter wide. It has been found that even if the projection 24 is itself about a micron high, it is, because of its salient nature, still satisfactorily removed. However, if an ordinary, unthickened electrolyte (e.g., 70% by volume aqueous solution of orthophosphoric acid) were employed in the usual way, the electro-erosion action would be excessive so that the whole of the conductor element 10d would be removed.

In general, the more viscous the electro-polishing electrolyte the better. In the specific electro-polishing electrolyte examples above, the quantity of sodium lauryl sulphate approximates saturation in the electrolyte, and sodium carboxymethylcellulose provides about the same viscosity. Of course, somewhat lesser amounts of these thickeners could be employed, to nearly the same effect.

The thickener and other ingredients utilized in the electrolyte 56 should take into account, where applicable, the current feeding film 20b aspect of the invention. For example, glycerol has been found to be unsuitable for use in the electrolyte 56 in the electro-polishing examples above, because it acts to depassivate the chromium 20b and expose the same to electrolytic attack.

Referring more specifically to alternative choices of materials for the elements 10d to be electro-polished and the current-feeding layer 20b: gold for element 10d with nickel for layer 20b, copper for element 10d with nickel for layer 20b, and gold for element 10d with chromium for layer 20b are favorable combinations. For electro-polishing gold elements 10d on a nickel or chromium layer 20b, a gold polishing electrolyte (such as a solution of 67.5 grams potassium cyanide, 15 grams potassium sodium tartrate, 15 grams potassium ferrocyanide, and 2.5 cc. ammonium hydroxide, in 1000 cc. of water), may be thickened with solid sodium carboxymethylcellulose. Afterward, the unwanted nickel in the layer 20b can be removed by a hydrochloric acid etch, or, if the layer 20b is chromium, it can be removed as in "Step 8" above. In the case of a copper-nickel element 10d-layer 20b combination, the copper can be electro-polished as in "Step 7" above, and the exposed nickel, used for the layer 20b, can thereafter be removed by a hydrochloric acid etch. In each case the metal of element 10d is a favorable choice as the material of the contact 44 and the cathode 62.

Of course, the choice of SiO as the insulating material is not critical. Mixtures of SiO and $SiO_2$, as well as many other commonly used insulating materials, would also serve. To the degree that the layer 20b remains intact, it protects the underlayer 18 from the electro-polishing electrolyte. The upper layer 14 of insulation is deposited after the electro-polishing and the etching steps and raises few problems of compatibility. The present invention has particular utility where the insulating layer 14 is about 2 microns in thickness, or in other words, of the order of 1 to 10 microns. Moreover, aspects of the invention would still be useful where the upper or overlayer 14 is of a material having some substantial conductivity but where avoidance of projections 24 or corners 30, 32 proximate thereto is desired.

While the invention has been particularly shown and described with reference to preferred embodiments thereof, it will be understood by those skilled in the art that various changes in form and details may be made therein without departing from the spirit and scope of the invention.

What is claimed is:

1. In the production of a deposited multilayer thin film assembly comprising a pair of conductor elements in different layers of said assembly with an insulating material layer in the order of one to ten microns thick therebetween, the improvement which comprises electro-polishing the outer face surface of the first of said elements to be deposited, before depositing said insulating material over said face surface, said first element being copper in the order of one micron thick, and said electro-polishing being undertaken in a viscous electrolyte, until said first element is substantially smoothed, said electrolyte consisting essentially of phosphoric acid and an effective amount of chemically inert thickening agent.

2. The improvement of claim 1, wherein said insulating layer is of silicon monoxide about two microns thick.

3. In the production of deposited multilayer thin film assembly comprising a pair of conductor elements in different layers of said assembly with an insulating material layer in the order of one to ten microns thick therebetween, at least the first of said conductor elements to be deposited being copper in the order of one micron thick, laid down over and in contact with an underlayer of chromium, the improvement which comprises electro-polishing the outer face surface of said first element before depositing said insulating material over said face surface, said underlayer being in electrical circuit with said first conductor element to comprise electropolishing current feeder means therefor, and said electro-polishnig being undertaken in a viscous electrolyte, until said first element is substantially smoothed, said electrolyte consisting essentially of phosphoric acid and an effective amount of chemically inert thickening agent.

4. The improvement of claim 3, including the step of breaking the path utilized by said electropolishing current by selective removal of portions of said underlayer after the electropolishing step without attacking said first element.

5. In the production of a deposited multilayer thin film assembly comprising a pair of conductor elements in different layers of said assembly with an insulating material layer in the order of one to ten microns thick therebetween, the improvement which comprises electro-polishing the outer face surface of the first of said elements to be deposited, before depositing said insulating material over said face surface, said first element being gold is in the order of one micron thick, and said electro-polishing being undertaken in a viscous electrolyte, until said first element is substantially smoothed, said electrolyte consisting essentially of potassium cyanide and an effective amount of chemically inert thickening agent.

6. In the production of a deposited multilayer thin film assembly comprising a pair of conductor elements in different layers of said assembly with an insulating material layer in the order of one to ten microns thick therebetween, at least the first of said conductor elements to be deposited being gold in the order of one micron thick, laid down over and in contact with an underlayer of material chosen from the group consisting of chromium and nickel, the improvement which comprises electro-polishing the outer face surface of said first element before depositing said insulating material over said face surface, said underlayer being in electrical circuit with said first conductor element to comprise electropolishing current feeder means therefor, and said electro-polishing being undertaken in a viscous electrolyte, until said first element is substantially smoothed, said electrolyte consisting essentially of potassium cyanide and an effective amount of chemically inert thickening agent.

7. The improvement of claim 6, including the step of breaking the path utilized by said electropolishing current by selective removal of portions of said underlayer after the electropolishing step without attacking said first element.

References Cited by the Examiner

UNITED STATES PATENTS

| | | | |
|---|---|---|---|
| 2,610,144 | 9/1952 | Eaton | 204—140.5 |
| 2,726,200 | 12/1955 | Holsapple | 204—224 |
| 2,758,074 | 8/1956 | Black et al. | 204—143 X |
| 2,784,155 | 3/1957 | Heinrich | 204—143 |
| 2,885,524 | 5/1959 | Eisler | 201—73 |
| 2,900,580 | 8/1959 | Beck | 317—101 |
| 2,971,176 | 2/1961 | Eisler | 338—314 |
| 3,058,895 | 10/1962 | Williams | 204—143 |
| 3,130,134 | 4/1964 | Jones | 204—15 |
| 3,174,920 | 3/1965 | Post | 204—143 |

FOREIGN PATENTS

| | | |
|---|---|---|
| 450,899 | 8/1948 | Canada. |

JOHN H. MACK, *Primary Examiner.*

R. K. MIHALEK, *Assistant Examiner.*